(12) United States Patent
Yamaguchi

(10) Patent No.: US 6,850,094 B2
(45) Date of Patent: Feb. 1, 2005

(54) SEMICONDUCTOR INTEGRATED CIRCUIT HAVING A PLURALITY OF THRESHOLD VOLTAGES

(75) Inventor: Akira Yamaguchi, Kitaadachi-gun (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/672,498

(22) Filed: Sep. 26, 2003

(65) Prior Publication Data

US 2004/0130348 A1 Jul. 8, 2004

(30) Foreign Application Priority Data

Sep. 26, 2002 (JP) ........................................ 2002-281203

(51) Int. Cl.[7] .............................................. H03K 19/094
(52) U.S. Cl. ........................ 326/121; 326/93; 326/119
(58) Field of Search .............................. 326/93–98, 112, 326/119, 121

(56) References Cited

U.S. PATENT DOCUMENTS

| | | | | |
|---|---|---|---|---|
| 5,982,199 A | * | 11/1999 | Yu | 326/121 |
| 6,078,195 A | * | 6/2000 | Chen | 326/121 |
| 6,111,434 A | * | 8/2000 | Ciraula et al. | 326/98 |
| 6,124,737 A | * | 9/2000 | Lan et al. | 326/121 |
| 6,208,170 B1 | * | 3/2001 | Iwaki et al. | 326/121 |
| 6,246,266 B1 | * | 6/2001 | Bosshart | 326/98 |
| 6,646,472 B1 | * | 11/2003 | Trivedi et al. | 326/93 |
| 2002/0008545 A1 | | 1/2002 | Zama et al. | |

FOREIGN PATENT DOCUMENTS

JP          P2002-9242          11/2002

* cited by examiner

*Primary Examiner*—Don Le
(74) *Attorney, Agent, or Firm*—Edward B. Weller; Gray Cary Ware & Freidenrich LLP (57) ABSTRACT

A logic circuit section comprises a plurality of first transistors of a first conductivity type and a plurality of second transistors of a second conductivity type, and is controlled according to an input signal. A third transistor of the first conductivity type supplies power to the logic circuit section. A fourth transistor of the second conductivity type is connected to the output terminal of the logic circuit section, and sets a level at the output terminal when the logic circuit section does not operate. The first and second transistors are controlled by a first control signal, and the third transistor is controlled by a second control signal different from the first control signal.

25 Claims, 6 Drawing Sheets

SEMICONDUCTOR INTEGRATED CIRCUIT HAVING A PLURALITY OF THRESHOLD VOLTAGES

CROSS-REFERENCE TO RELATED APPLICATIONS

This application is based upon and claims the benefit of priority from the prior Japanese Patent Application No. 2002-281203, filed Sep. 26, 2002, the entire contents of which are incorporated herein by reference.

BACKGROUND OF THE INVENTION

1. Field of the Invention

The present invention relates to an SMTCMOS (Selective Multi Threshold Complementary Metal-oxide Semiconductor) having, for example, a plurality of threshold voltages.

2. Description of the Related Art

Figure 7:
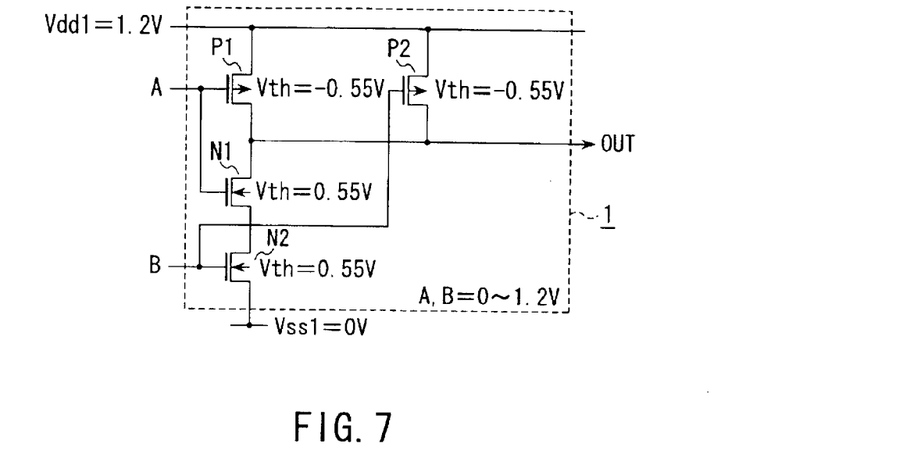
FIG. 7 is a circuit diagram illustrating a two-input NAND circuit example related to the invention.

FIG. 7 shows a two-input NAND circuit 1. The NAND circuit 1 comprises P-channel MOS transistors (hereinafter referred to as "PMOS transistors") P1 and P2, and N-channel MOS transistors (hereinafter referred to as "NMOS transistors") N1 and N2. The threshold voltage of the PMOS transistors P1 and P2 is set to, for example, −0.55 V, while that of the NMOS transistors N1 and N2 is set to, for example, 0.55 V. First and second power supply voltages Vdd1 and Vss1 are set to, for example, 1.2 V and 0 V, respectively. The high and low levels of an input signal A supplied to the gates of the transistors P1 and N1 are set to 1.2 V and 0 V, respectively. Similarly, the high and low levels of an input signal B supplied to the gates of the transistors P2 and N2 are set to 1.2 V and 0 V, respectively.

Figure 8:
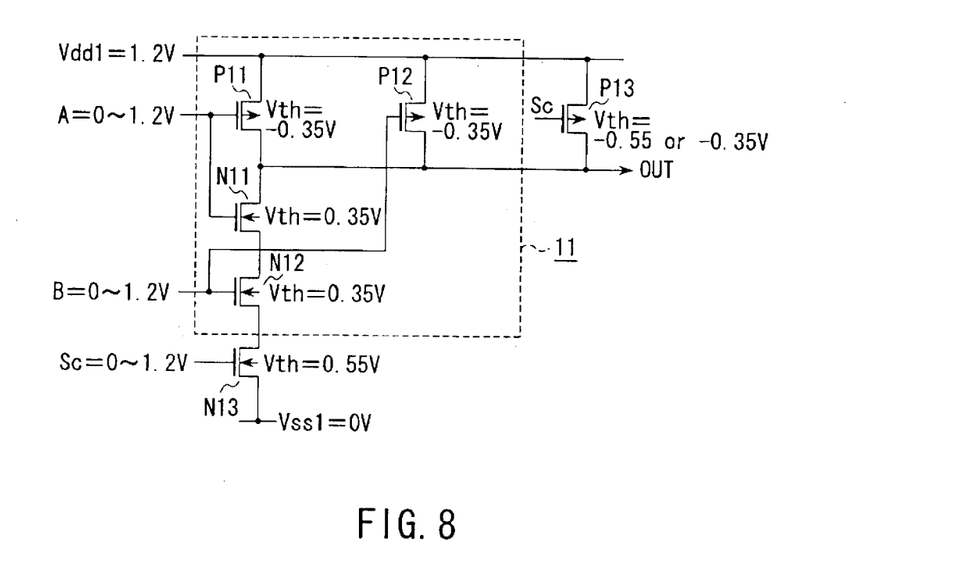
FIG. 8 is a circuit diagram of a two-input NAND circuit example related to the invention and utilizing an SMTC-MOS.

FIG. 8 illustrates a two-input NAND circuit example 11 utilizing an SMTCMOS. The NAND circuit 11 comprises PMOS transistors P11 and P12 and NMOS transistors N11 and N12. The threshold voltage of the PMOS transistors P11 and P12 is set to, for example, −0.35 V, while that of the NMOS transistors N11 and N12 is set to, for example, 0.35 V. The first and second power supply voltages Vdd1 and Vss1 are set to, for example, 1.2 V and 0 V, is respectively.

The source of the NMOS transistor N12 is connected to the drain of an NMOS transistor N13. The source of the NMOS transistor N13 is supplied with the second power supply voltage Vss1 (0 V). The threshold voltage of the NMOS transistor N13 is set to, for example, 0.55 V. The NMOS transistor N13 performs switching to supply a power supply voltage to the NAND circuit 11 or to stop the supply of the power supply voltage. The NMOS transistor N13 is controlled by a control signal Sc so that it is ON during the operation of the NAND circuit 11, and OFF during the non-operation (standby state) of the circuit 11.

A PMOS transistor P13 is connected in parallel to the PMOS transistor P12. The PMOS transistor P13 is controlled by the control signal Sc so that it is ON during the non-operation of the NAND circuit 11, thereby setting the output terminal OUT of the NAND circuit 11 to a high level regardless of an input signal. The threshold voltage of the PMOS transistor P13 is set to, for example, −0.55 V or −0.35 V. The high and low levels of the input signal A supplied to the gates of the transistors P11 and N11 are set to 1.2 V and 0 V, respectively. Similarly, the high and low levels of the input signal B supplied to the gates of the transistors P12 and N12 are set to 1.2 V and 0 V, respectively. Further, the high and low levels of the control signal Sc supplied to the gates of the transistors N13 and P13 are also set to 1.2 V and 0 V, respectively.

In logic circuits of this type, the total ON resistance is determined according to the required operation speed. In the NAND circuit 1 shown in FIG. 7 and NAND circuit 11 shown in FIG. 8, the required ON resistance is, for example, 1.2 kΩ or less. The ON resistance of this type of NAND circuit is determined from the resistances of the NMOS transistors incorporated therein. In the NAND circuit 1 of FIG. 7, when the first power supply voltage Vdd1 is 1.2 V, the ON resistance of each of the NMOS transistors N1 and N2 is set to approx. 600 Ω. Accordingly, the total ON resistance of the NMOS transistors N1 and N2 is 1.2 kΩ, which meets the specification.

In the NAND circuit 11 of FIG. 8, when the first power supply voltage Vdd1 is 1.2 V, the ON resistance of each of the NMOS transistors N11 and N12 is set to approx. 100 Ω. Further, the ON resistance of the NMOS transistor N13 is set to approx. 600 Ω. Accordingly, the total ON resistance is 800 Ω, which satisfies the specification concerning the maximum total ON resistance (1.2 kΩ). Thus, any specification can be satisfied by appropriately setting the ON resistance of each transistor.

However, in recent semiconductor integrated circuits for use in, for example, cellular phones, there is a demand for further reducing the power supply voltage, to save power. Power consumption Pc is given by the following equation:

$$Pc = f \cdot C \cdot V^2$$

where $f$ represents frequency, C parasitic capacitance, and V power supply voltage.

To save power, for example, the first power supply voltage Vdd1 and the high level of an input signal may be reduced from 1.2 V to 1.0 V. In the circuit shown in FIG. 7, it is necessary to reduce the leak current in the non-operation period, therefore the threshold voltage of each transistor is set high. In this case, if the power supply voltage and signal voltage are reduced as described above, without changing the threshold voltage of each transistor, the ON resistance of each of the NMOS transistors N1 and N2 is increased from 600 Ω to 1.2 kΩ, thereby increasing the total ON resistance from 1.2 kΩ to 2.4 kΩ. Thus, it is almost impossible to satisfy the specification concerning the maximum total ON resistance. Moreover, an increase in the total ON resistance makes it difficult for the circuit to perform high-speed operations. In order to avoid this, if the threshold voltage of each transistor is reduced to reduce the total ON resistance, the leak current inevitably increases. In light of this, it is not advisable to reduce the threshold voltage. Thus, it is difficult to achieve voltage reduction in the circuit of FIG. 7.

On the other hand, in the circuit shown in FIG. 8, the threshold voltage of each transistor incorporated in the NAND circuit 11 is set low. Therefore, if the power supply voltage and signal voltage are reduced from 1.2 V to 1.0 V, the ON resistance of each of the NMOS transistors N11 and N12 becomes approx. 200 Ω. This ON resistance does not significantly influence high-speed operations. However, the threshold voltage of the NMOS transistor N13 for supply of a power voltage is set higher than that of the transistors incorporated in the NAND circuit 11. Therefore, if the power supply voltage and signal voltage are reduced to 1.0 V, the ON resistance of the NMOS transistor N13 becomes 1.2 kΩ. As a result, the total ON resistance becomes 1.6 kΩ, which makes it very difficult to satisfy the specification concerning the maximum total ON resistance of 1.2 kΩ. Moreover, an increase in the total ON resistance makes it difficult for the circuit to perform high-speed operations. In light of the above, there is a demand for the development of a semiconductor integrated circuit that incorporates a logic circuit section drivable by a low voltage, and can operate at a high speed.

BRIEF SUMMARY OF THE INVENTION

According to an aspect of the invention, there is provided a semiconductor integrated circuit comprising: a logic circuit section formed of a plurality of first transistors of a first conductivity type and a plurality of second transistors of a second conductivity type, the logic circuit section being controlled according to an input signal; a third transistor of the first conductivity type configured to supply power to the logic circuit section; a fourth transistor of the second conductivity type connected to an output terminal of the logic circuit section, the fourth transistor setting a level at the output terminal when the logic circuit section does not operate; a first control signal used to control the first and second transistors; and a second control signal different from the first control signal and used to control the third transistor.

According to another aspect of the invention, there is provided a semiconductor integrated circuit comprising: a logic circuit section formed of a plurality of first transistors of a first conductivity type and a plurality of second transistors of a second conductivity type, the logic circuit section being controlled according to an input signal; a third transistor of the second conductivity type configured to supply power to the logic circuit section; a fourth transistor of the first conductivity type connected to an output terminal of the logic circuit section, the fourth transistor setting a level at the output terminal when the logic circuit section does not operate; a first control signal used to control the first and second transistors; a second control signal used to control the third transistor; and a third control signal used to control the fourth transistor.

According to further aspect of the invention, there is provided a semiconductor integrated circuit comprising: a first node supplied with a first power supply voltage; a second node supplied with a second power supply voltage lower than the first power supply voltage; a logic circuit section formed of a plurality of first transistors of a first conductivity type and a plurality of second transistors of a second conductivity type, the logic circuit section being controlled according to an input signal, a current path of each of the second transistors having one end connected to the first node, and another end connected to an output terminal of the logic circuit section; a third transistor of the first conductivity type connected between the logic circuit section and the second node; a fourth transistor of the second conductivity type connected between the first node and the output terminal of the logic circuit section, the fourth transistor setting a level at the output terminal to the first power supply voltage when the logic circuit section does not operate; a first control signal used to control the first and second transistors; a second control signal different from the first control signal and used to control the third transistor; and a third control signal different from the first control signal and used to control the fourth transistor.

According to yet another aspect of the invention, there is provided a semiconductor integrated circuit comprising: a first node supplied with a first power supply voltage; a second node supplied with a second power supply voltage lower than the first power supply voltage; a logic circuit section formed of a plurality of first transistors of a first conductivity type and a plurality of second transistors of a second conductivity type, the logic circuit section being controlled according to an input signal, a current path of each of the first transistors having one end connected to an output terminal of the logic circuit section, and another end connected to the second node; a third transistor of the second conductivity type connected between the logic circuit section and the first node; a fourth transistor of the first conductivity type connected between the output terminal of the logic circuit section and the second node, the fourth transistor setting a level at the output terminal to the first power supply voltage when the logic circuit section does not operate; a first control signal used to control the first and second transistors; a second control signal different from the first control signal and used to control the third transistor; and a third control signal different from the first control signal and used to control the fourth transistor.

DETAILED DESCRIPTION OF THE INVENTION

Embodiments of the invention will be described in detail with reference to the accompanying drawings.

First Embodiment

Figure 1:
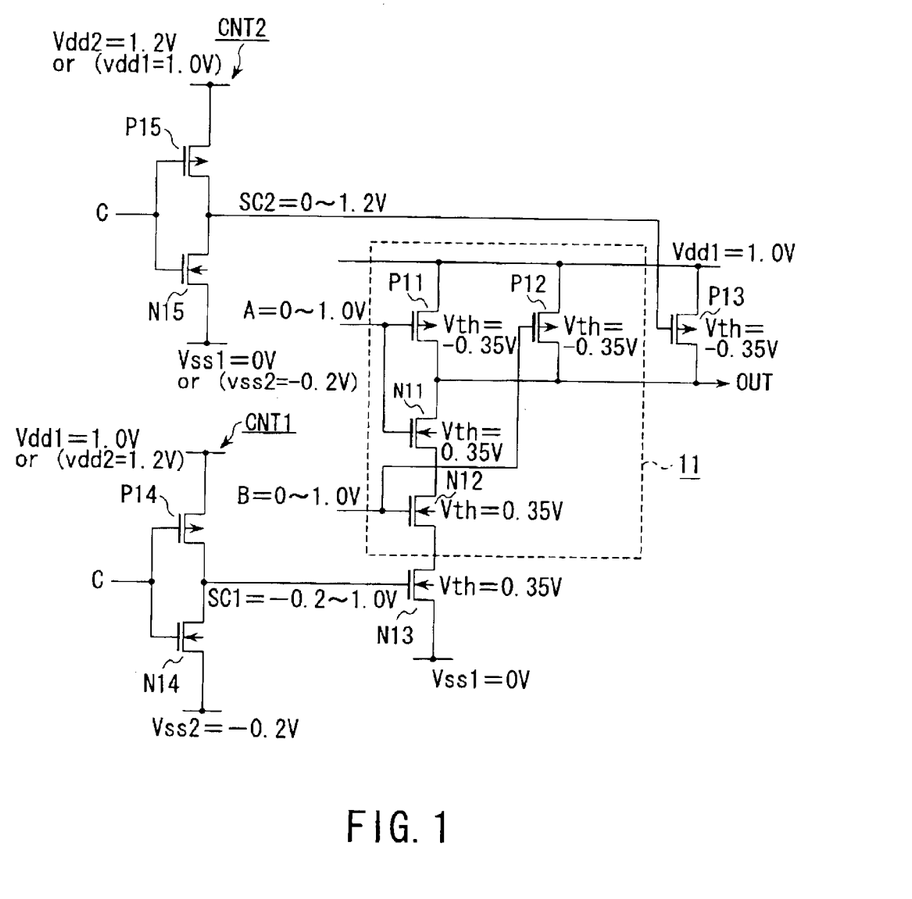
FIG. 1 is a circuit diagram illustrating a first embodiment of the invention.

FIG. 1 shows a two-input NAND circuit utilizing an SMTCMOS and used as a logic circuit, according to a first embodiment. In FIG. 1, a NAND circuit 11 comprises PMOS transistors P11 and P12 and NMOS transistors N11 and N12. The threshold voltage of each of the PMOS transistors P11 and P12 is set to, for example, −0.35 V, while that of each of the NMOS transistors N11 and N12 is set to, for example, 0.35 V. In other words, the PMOS and NMOS transistors P11, P12, N11 and N12 have threshold voltages of an equal absolute value. The sources of the PMOS transistors P11 and P12 are supplied with a first power supply voltage Vdd1. The first power supply voltage Vdd1 is, for example, 1.0 V. The drains of the PMOS transistors P11 and P12 are connected to the drain of the NMOS transistor N11. The source of the NMOS transistor N11 is connected to the drain of the NMOS transistor N12. The high and low levels of an input signal A supplied to the gates of the transistors P11 and N11 are set to 1.0 V and 0 V, respectively. Similarly, the high and low levels of an input signal B supplied to the gates of the transistors P12 and N12 are set to 1.0 V and 0 V, respectively.

An NMOS transistor N13 for supplying power to the NAND circuit 11 is connected between the source of the NMOS transistor N12 and a second power supply voltage Vss1 (e.g. 0 V). The threshold voltage of the transistor N13 is set to, for example, 0.35 V. The gate of the transistor N13 is supplied with a first control signal SC1. The low level of the first control signal SC1 are set to, for example, −0.2 V, and the high level of the signal is set to, for example, 1.0 V/1.2 V. The transistor N13 controls the supply of power to the NAND circuit 11 in accordance with the first control signal SC1.

The first control signal SC1 is generated by a first control circuit CNT1. The first control circuit CNT1 is formed of, for example, a CMOS inverter circuit. PMOS and CMOS transistors P14 and N14 incorporated in the CMOS inverter circuit are connected in series between a node supplied with the first power supply voltage Vdd1, and a node supplied with a third power supply voltage Vss2. Instead of the first power supply voltage Vdd1, a power supply voltage Vdd2 described later may be used. The third power supply voltage Vss2 is set to, for example, −0.2 V. A control signal C is supplied to the gates of the transistors P14 and N14. The high and low levels of the control signal C are set to, for example, 1.0 V and 0 V, respectively.

A PMOS transistor P13 for setting an output level is connected between the output terminal OUT of the NAND circuit 11 and a node supplied with the first power supply voltage Vdd1. The threshold voltage of the transistor P13 is set to, for example, −0.35 V. The gate of the transistor P13 is supplied with a second control signal SC2. The low and high levels of the second control signal SC2 are set to, for example, 0 V and 1.2 V, respectively. In accordance with the second control signal SC2, the transistor P13 holds the first power supply voltage Vdd1 at the output terminal OUT when the NAND circuit 11 is OFF.

The first control signal SC2 is generated by a second control circuit CNT2. The second control circuit CNT2 is formed of, for example, a CMOS inverter circuit. PMOS and CMOS transistors P15 and N15 incorporated in the CMOS inverter circuit are connected in series between a node supplied with the second power supply voltage Vss1, and a node supplied with a fourth power supply voltage Vdd2. The fourth power supply voltage Vdd2 is set to, for example, 1.2 V. The control signal C is supplied to the gates of the transistors P15 and N15. The level range of the second control signal SC2 is not limited to from 0 V to 1.2 V, but may be from 0 V to 1.0 V, 0 V to 1.2 V from −0.2 V to 1.0 V, or from −0.2 V to 1.2 V. In this case, it is sufficient if Vdd2 is set equal to the Vdd1, i.e., 1.0 V.

The threshold voltage of each of the NMOS transistors N14 and N15 incorporated in the first and second control circuits CNT1 and CNT2 is set to, for example, 0.35 V, while the threshold voltage of each of the PMOS transistors P14 and P15 is set to, for example, −0.35 V. However, the threshold voltages of the NMOS transistors N14 and N15 and PMOS transistors P14 and P14 are not limited to 0.35 V and −0.35 V, respectively.

In the first embodiment, the threshold voltages of the transistors P11, P12, N11 an N12 incorporated in the NAND circuit 11, transistor N13 for power supply, and PMOS transistor P13 for setting the output level are set to have an absolute value of 0.35 V. Further, the voltage for controlling the transistors P11, P12, N11 an N12 of the NAND circuit 11 is set different from the voltage for controlling the transistor N13 for power supply and PMOS transistor P13 for setting the output level. Accordingly, even if the first power supply voltage Vdd1 is reduced from 1.2 V to 1.0 V as shown in FIGS. 7 and 8, the total ON resistance of the NMOS transistors can be reduced to a value that falls within the required range of 1.2 kΩ or less. This means that the NAND circuit 11 can operate at a high speed. More specifically, the ON resistances of the transistors N11, N12 and N13 assumed when the poser supply voltage is 1.0 V are approx. 200 Ω, 200 Ω and 600 Ω, respectively. Therefore, the total ON resistance is approx. 1 kΩ, which is lower than the aforementioned required ON resistance of 1.2 kΩ or less.

As described above, the power consumption of the circuit during operation is proportional to the square of the power supply voltage (Pc=f·C·V² where f represents frequency, C parasitic capacitance, and V power supply voltage). Since the circuit shown in FIG. 1 can be controlled using a low power supply voltage (Vdd1), its power consumption can be suppressed.

Furthermore, the low level of the first control signal SC1 supplied to the gate of the transistor N13, which is used for power supply when the circuit is OFF, is set to −0.2 V. This enables the transistor N13 of a low threshold voltage to be reliably turned off, thereby suppressing the leak current. Thus, the leak current of the circuit shown in FIG. 1 is minimized when the circuit is OFF. Therefore, it is very advantageous to employ this circuit in, for example, mobile devices.

Moreover, the NMOS transistors N11 and N12 forming the NAND circuit 11, and the NMOS transistor N13 for power supply have the same threshold value. Accordingly, when the NMOS transistors N11, N12 and N13 are formed, an impurity can be implanted using a single mask. If the NMOS transistors N11 and N12 have a threshold voltage different from that of the NMOS transistor N13, it is necessary to implant an impurity using two masks—one for the NMOS transistors N11 and N12, and the other for the NMOS transistor N13. In this case, it is also necessary to widen the space between the transistors N12 and N13 in order to secure an alignment margin for the two masks. In other words, if the NMOS transistors N11 and N12 have a threshold voltage different from that of the NMOS transistor N13, the layout area is increased by the alignment margin for the two masks, and the number of manufacturing steps is increased.

On the other hand, if the NMOS transistors N11, N12 and N13 have the same threshold value, implantation of an impurity for the transistors N11 and N12 can be performed simultaneously with that for the transistor N13, using a single mask. This can suppress an increase in the area of the circuit and in the number of manufacturing steps.

Second Embodiment

Figure 2:
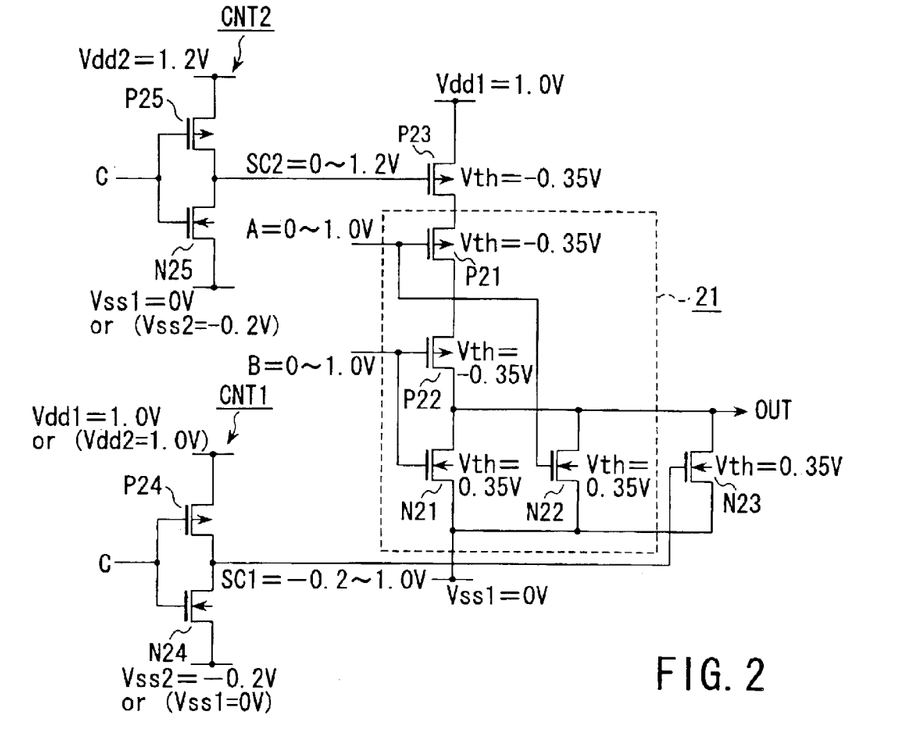
FIG. 2 is a circuit diagram illustrating a second embodiment of the invention.

FIG. 2 illustrates a second embodiment in which a NOR circuit utilizing an SMTCMOS is used as a logic circuit example. As shown, a NOR circuit 21 comprises PMOS transistors P21 and P22 and NMOS transistors N21 and N22. The threshold voltage of each of the PMOS transistors P21 and P22 is set to, for example, −0.35 V, while that of each of the NMOS transistors N21 and N22 is set to, for example, 0.35 V. The PMOS transistors P21 and P22 are connected in series, and the drain of the PMOS transistor P22 is connected to the drains of the NMOS transistors N21 and N22. The sources of the NMOS transistor N21 and N22 are connected to a node supplied with the second power supply voltage Vss1 (0 V). The low and high levels of an input signal A supplied to the gates of the transistors P21 and N22 are set to 0 V and 1.0 V, respectively. Similarly, the low and high levels of an input signal B supplied to the gates of the transistors P22 and N21 are set to 0 V and 1.0 V, respectively.

An NMOS transistor N23 for setting the output level when the NOR circuit 21 does not operate is connected between the output terminal OUT of the NOR circuit 21 and the node supplied with the second power supply voltage Vss1. The threshold voltage of the transistor N23 is set to, for example, 0.35 V. The gate of the transistor N23 is supplied with a first control signal SC1. The low level of the first control signal SC1 are set to, for example, −0.2 V (or 0 V), and the high level of the signal is set to, for example, 1.0 V (or 1.2 V). The transistor N23 holds, at the second power supply voltage Vss1, the voltage at the output terminal OUT in accordance with the first control signal SC1, when the NOR circuit 21 does not operate.

The first control signal SC1 is generated by a first control circuit CNT1. The first control circuit CNT1 is formed of, for example, a CMOS inverter circuit. PMOS and CMOS transistors P24 and N24 incorporated in the CMOS inverter circuit are connected in series between a node supplied with the first power supply voltage Vdd1 (or the fourth power supply voltage Vdd2), and a node supplied with the third power supply voltage Vss2 (or Vss1). The third power supply voltage Vss2 is set to, for example, −0.2 V. A control signal C is supplied to the gates of the transistors P24 and N24. The level range of the control signal C is not limited to from −0.2 V to 1 V, but may be from −0.2 V/0 V or from 1 V/1.2 V.

A PMOS transistor P23 for power supply is connected between the source of the PMOS transistor P21 and a node supplied with the first power supply voltage Vdd1 (1.0 V). The threshold voltage of the transistor P23 is set to, for example, −0.35 V. A second control signal SC2 is supplied to the gate of the transistor P23. The low level of the second control signal SC2 is set to, for example, 0 V (or −0.2 V), and the high level of the signal SC2 is set to a value, such as 1.2 V, higher than Vdd1. In accordance with the second control signal SC2, the supply of power to the NOR circuit 21 is controlled.

The first control signal SC2 is generated by a second control circuit CNT2. The second control circuit CNT2 is formed of, for example, a CMOS inverter circuit. PMOS and CMOS transistors P25 and N25 incorporated in the CMOS inverter circuit are connected in series between a node supplied with the fourth power supply voltage Vdd2, and a node supplied with the second power supply voltage Vss1 (or Vss2). The fourth power supply voltage Vdd2 is set to, for example, 1.2 V. The control signal C is also supplied to the gates of the transistors P25 and N25. The range of the second control signal SC2 is not limited to from 0 V to 1.2 V, but may be from −0.2 V to 1.2 V.

The threshold voltage of each of the NMOS transistors N24 and N25 incorporated in the first and second control circuits CNT1 and CNT2 is set to, for example, 0.35 V, while the threshold voltage of each of the PMOS transistors P24 and P25 is set to, for example, −0.35 V. However, the threshold voltages of the NMOS transistors N24 and N25 and PMOS transistors P24 and P25 are not limited to 0.35V and −0.35V, respectively.

In the second embodiment, the threshold voltages of the transistors P21, P22, N21 an N22 incorporated in the NOR circuit 21, transistor P23 for power supply, and PMOS transistor N23 for setting the output level are set to have an absolute value of 0.35 V. Thus, the transistors of the NOR circuit 21, transistor P23 for power supply and PMOS transistor N23 for setting the output level are controlled by different voltages. Therefore, even if the first power supply voltage Vdd1 is reduced from 1.2 V to 1.0 V as shown in FIGS. 7 and 8, the total ON resistance of the NMOS transistors can be reduced to a value that falls within the required range. This means that the NOR circuit 21 can operate at a high speed.

Furthermore, the low level of the first control signal SC1 supplied to the gate of the transistor N23 is set to −0.2 V, and the high level of the second control signal SC2 supplied to the gate of the transistor P23 is set to 1.2 V. Therefore, the transistors N23 and P23 of a low threshold value can be reliably maintained off to suppress the leak current.

Moreover, the NMOS transistors N21 and N22 incorporated in the NOR circuit 21 and the NMOS transistor N23 for setting the output level have the same threshold value. Accordingly, implantation of an impurity for forming the NMOS transistors N21 and N22 of the NOR circuit 21 and that for forming the NMOS transistor N23 can be performed simultaneously, using a single mask. This can suppress an increase in the layout area of the circuit and in the number of its manufacturing steps.

Third Embodiment

Figure 3:
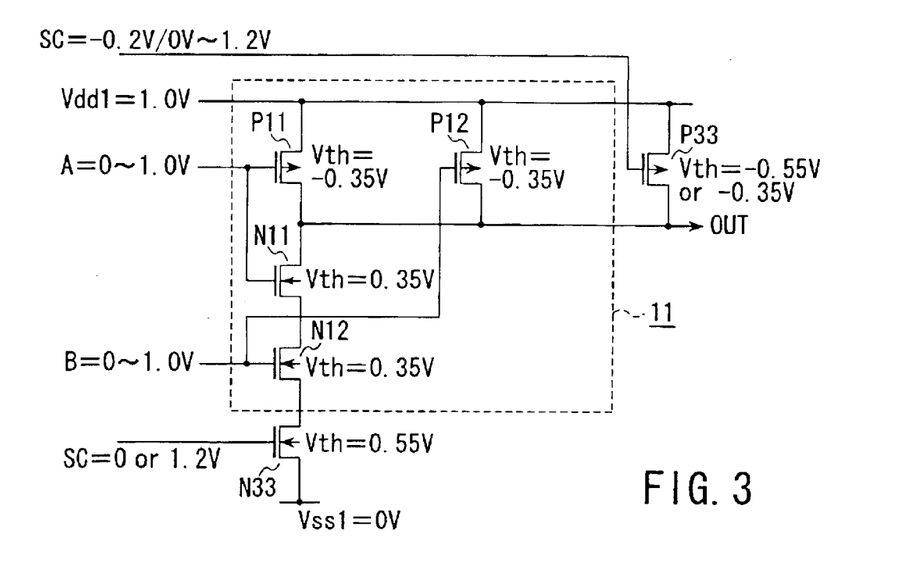
FIG. 3 is a circuit diagram illustrating a third embodiment of the invention.

FIG. 3 shows a third embodiment. In FIG. 3, elements similar to those of the first embodiment are denoted by corresponding reference numerals. A description will now be given only of different elements.

In the first embodiment, the threshold voltages of the transistors P11, P12, N11 and N12 incorporated in the NAND circuit 11, transistor N13 for power supply and transistor P13 for setting the output level are set to have the same absolute value of 0.35 V. On the other hand, in the third embodiment, the threshold voltages of the transistors P11, P12, N11 and N12 of the NAND circuit 11 are set to have the same absolute value of 0.35 V, while the threshold voltage of the transistor N33 for power supply is set to, for example, 0.55 V. Further, the threshold voltage of the transistor P33 for setting the output level is set to, for example, −0.55 V or −0.35 V.

The control signal SC supplied to the gates of the transistors N33 and P33 has its low level set to, for example, 0 V. Further, the high level of the control signal SC is set to, for example, 1.2 V if the threshold voltage of the NMOS transistor N33 has an absolute value of 0.55 V.

Figure 4:
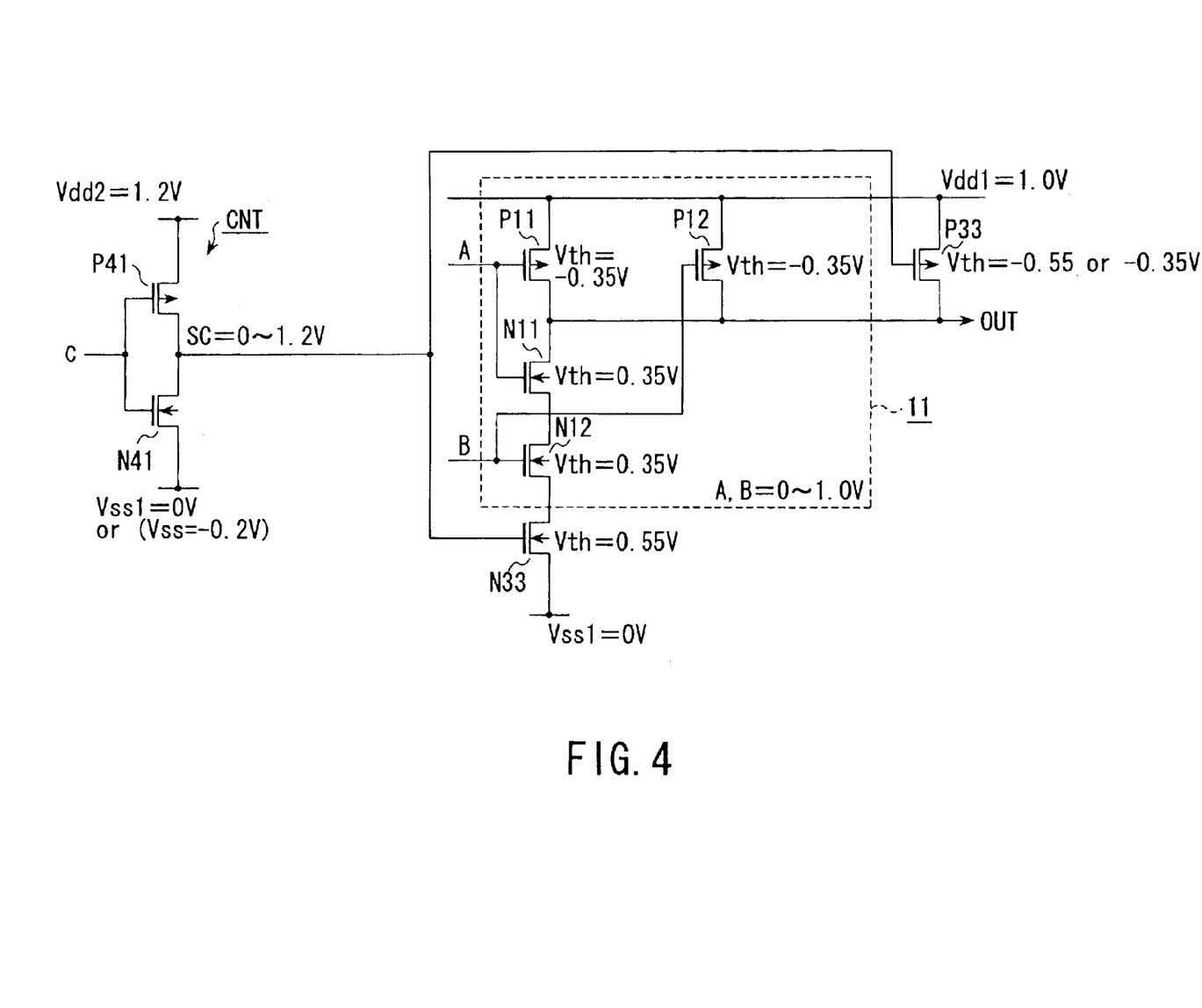
FIG. 4 is a circuit diagram illustrating another example of the third embodiment that incorporates a control circuit.

FIG. 4 shows a control circuit example for generating the control signal SC. In FIGS. 3 and 4, like reference numerals denote like elements.

The control circuit CNT shown in FIG. 4 is formed of a CMOS inverter circuit. PMOS and NMOS transistors P41 and N41 incorporated in the CMOS inverter circuit are connected in series between a node supplied with the first or fourth power supply voltage Vdd1 or Vdd2, and a node supplied with the second or third power supply voltage Vss1 or Vss2. The high level of the control signal SC is set to fourth power supply voltage Vdd2, for example, 1.2 V, if the threshold voltage of each of the NMOS transistor N33 has an absolute value of 0.55 V. The control signal C is supplied to the gates of the transistors P41 and N41.

In the third embodiment, the threshold voltages of the transistors P11, P12, N11 and N12 incorporated in the NAND circuit 11 are set to have an absolute value of 0.35 V, and are controlled by the first power supply voltage Vdd1 (1.0 V). Further, the transistor N33 for power supply has its threshold voltage set to 0.55 V, and is controlled by a voltage higher than the first power supply voltage Vdd1. This prevents an increase in the total ON resistance, therefore enables the circuit to perform a high-speed operation. Specifically, the ON resistance of each of the transistors N11 and N12 is substantially 200 Ω when the power supply voltage is 1.0 V, while the ON resistance of the transistor N33 is substantially 600 Ω when the power supply voltage is 1.2 V. Thus, the total ON resistance is 1 kΩ, which falls within the required range of 1.2 kΩ or less.

Further, since the power supply voltage for the NAND circuit 11 can be reduced, the power consumption can be reduced.

In addition, since the control signal SC can control both the NMOS transistor N33 and PMOS transistor P33, the control circuit CNT for generating the control signal SC can be made simple in structure.

Fourth Embodiment

Figure 5:
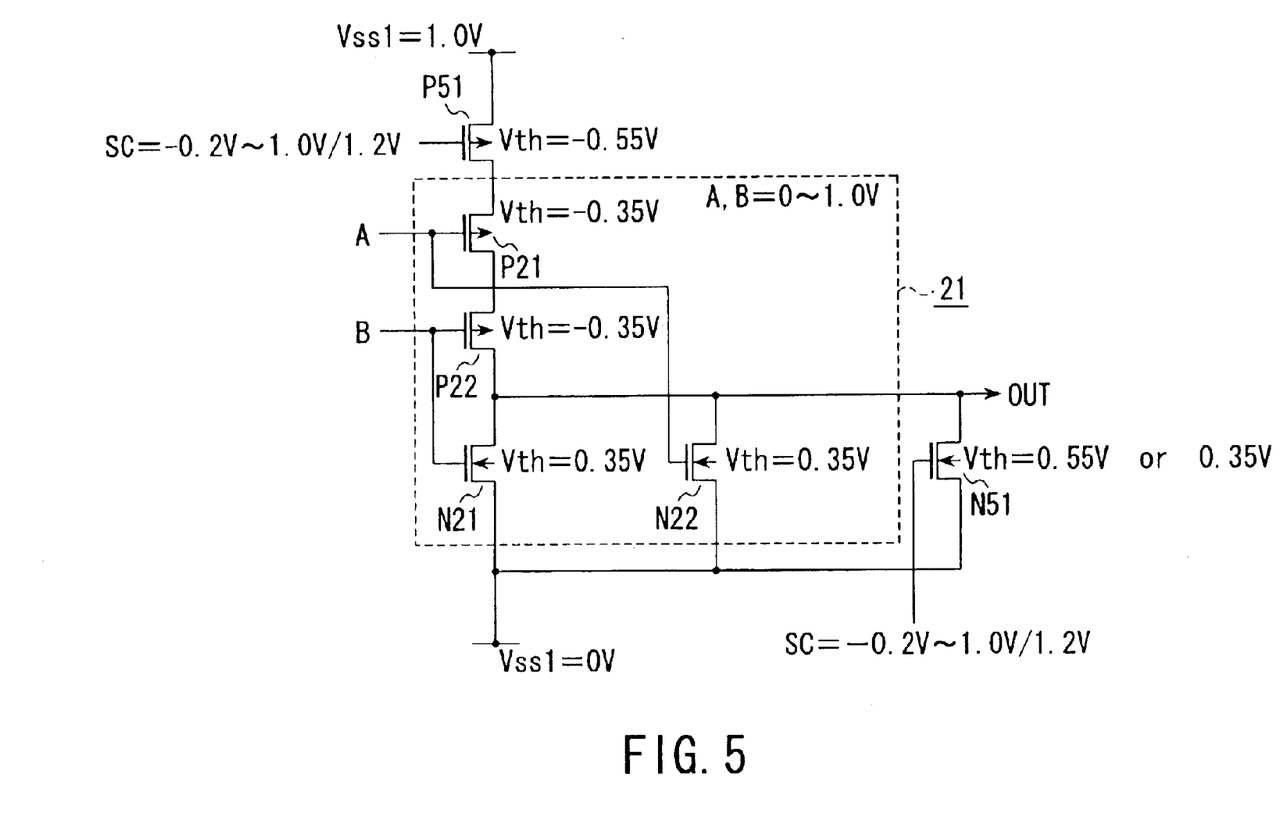
FIG. 5 is a circuit diagram illustrating a fourth embodiment of the invention.

FIG. 5 illustrates a NOR circuit utilizing an SMTCMOS, according to a fourth embodiment. In FIGS. 5 and 2, like reference numerals denote like elements. A description will be given only of different elements.

In FIG. 5, the threshold voltages of a plurality of transistors incorporated in a NOR circuit 21 are set to have an absolute value of 0.35 V. A PMOS transistor P51 for power supply has its threshold voltage set to, for example, −0.55 V. A control signal SC is supplied to the gate of the transistor P51. The low and high levels of the control signal SC are set to, for example, −0.2 V and 1.0 V (or 1.2 V), respectively. Further, an NMOS transistor N51 for setting an output level has its threshold voltage set to, for example, 0.55 V or 0.35 V. The control signal SC is supplied to the gate of the NMOS transistor N51.

Figure 6:
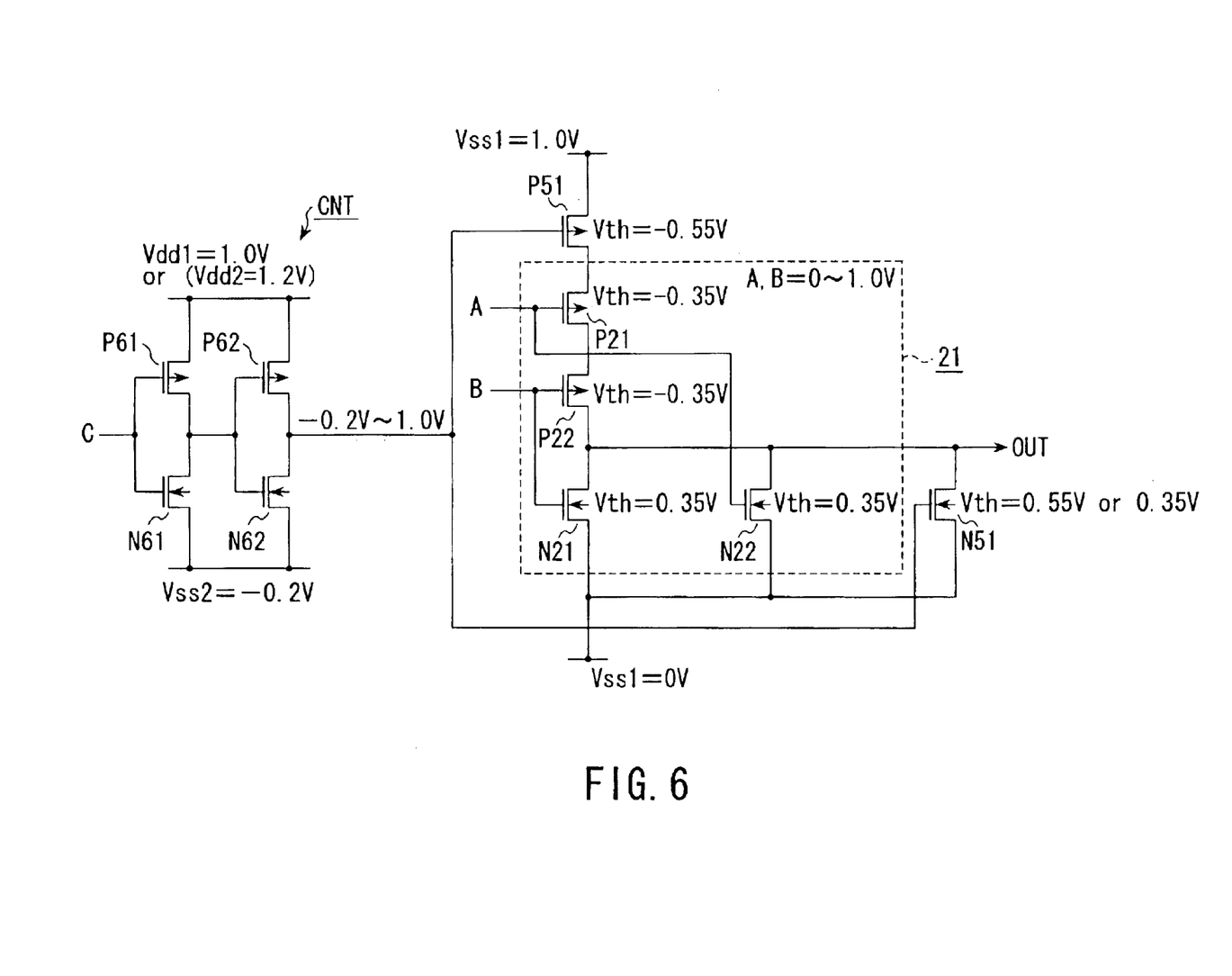
FIG. 6 is a circuit diagram illustrating another example of the fourth embodiment that incorporates a control circuit.

FIG. 6 shows a control circuit example CNT for generating the control signal SC. This control circuit CNT comprises first and second CMOS inverter circuits connected in series. The first CMOS inverter circuit comprises PMOS and CMOS transistors P61 and N61, which are connected in series between a node supplied with the first power supply voltage Vdd1 (1.0 V), and a node supplied with the third power supply voltage Vss2 (−0.2 V). A control signal C is supplied to the gates of the transistors P61 and N61. Instead of the first power supply voltage Vdd1, the power supply voltage Vdd2 (1.2 V) may be used.

The second CMOS inverter circuit comprises PMOS and CMOS transistors P62 and N62, which are connected in series between a node supplied with the first power supply voltage Vdd1 (1.0 V), and a node supplied with the third power supply voltage Vss2 (−0.2 V). The gates of the transistors P62 and N62 are connected to the connection node of the transistors P61 and N61. The connection node of the transistors P62 and N62 is connected to the gates of the transistors P51 and N51.

In the fourth embodiment, the threshold voltages of the transistors P21, P22, N21 and N22 incorporated in the NOR circuit 21 are set to have an absolute value of 0.35 V, and are controlled by the first power supply voltage Vdd1 (1.0 V). Further, the transistor P51 for power supply has its threshold voltage set to −0.55 V, and is controlled by the first power supply voltage Vdd1 and a negative voltage of −0.2 V. This prevents an increase in the total ON resistance, therefore enables the circuit to perform a high-speed operation. Specifically, the ON resistance of the transistor P51 is substantially 600 Ω when the voltage is −0.2 V. Accordingly, the total ON resistance is substantially 1 kΩ, which falls within the required range of 1.2 kΩ or less.

Further, since the power supply voltage for the NOR circuit 21 can be reduced, the power consumption can be reduced.

In addition, since the control signal SC can control both the PMOS transistor P51 and NMOS transistor N51, the control circuit CNT for generating the control signal SC can be made simple in structure.

The first to fourth power supply voltages and the threshold voltage of each transistor are not limited to the above-mentioned ones.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
    a logic circuit section formed of a plurality of first transistors of a first conductivity type and a plurality of second transistors of a second conductivity type, the logic circuit section being controlled according to an input signal;
    a third transistor of the first conductivity type configured to supply power to the logic circuit section;
    a fourth transistor of the second conductivity type connected to an output terminal of the logic circuit section, the fourth transistor setting a level at the output terminal when the logic circuit section does not operate;
    a first control signal used to control the first and second transistors; and
    a second control signal different from the first control signal and used to control the third transistor.

2. The circuit according to claim 1, wherein threshold voltages of the first to fourth transistors are set to have a single absolute value.

3. The circuit according to claim 1, wherein a high level of the first control signal is a first voltage, and a low level of the first control signal is a second voltage lower than the first voltage, a high level of the second control signal being the first voltage, a low level of the second control signal being a third voltage lower than the second voltage.

4. The circuit according to claim 3, wherein the third voltage is a negative voltage.

5. The circuit according to claim 1, wherein an absolute value of threshold voltages of the first and second transistors of the logic circuit section is set to a first threshold voltage, the third transistor being set to have a second threshold voltage whose absolute value is higher than an absolute value of the first threshold voltage, the fourth transistor being set to have one of the first and second threshold voltages.

6. The circuit according to claim 5, wherein the third and fourth transistors are controlled by a single voltage.

7. A semiconductor integrated circuit comprising:
    a logic circuit section formed of a plurality of first transistors of a first conductivity type and a plurality of second transistors of a second conductivity type, the logic circuit section being controlled according to an input signal;
    a third transistor of the second conductivity type configured to supply power to the logic circuit section;
    a fourth transistor of the first conductivity type connected to an output terminal of the logic circuit section, the fourth transistor setting a level at the output terminal when the logic circuit section does not operate;
    a first control signal used to control the first and second transistors;
    a second control signal used to control the third transistor; and
    a third control signal used to control the fourth transistor.

8. The circuit according to claim 7, wherein threshold voltages of the first to fourth transistors are set to have a single absolute value.

9. The circuit according to claim 7, wherein a high level of the first control signal is a first voltage, and a low level of the first control signal is a second voltage lower than the first voltage, a high level of the third control signal being the first voltage, a low level of the third control signal being a third voltage lower than the second voltage.

10. The circuit according to claim 9, wherein the third voltage is a negative voltage.

11. The circuit according to claim 9, wherein a high level of the second control signal is a fourth voltage higher than the first voltage.

12. The circuit according to claim 7, wherein an absolute value of threshold voltages of the first and second transistors of the logic circuit section is set to a first threshold voltage, the third transistor being set to have a second threshold voltage whose absolute value is higher than an absolute value of the first threshold voltage, the fourth transistor being set to have one of the first and second threshold voltages.

13. The circuit according to claim 7, wherein the third and fourth transistors are controlled by a single voltage.

14. A semiconductor integrated circuit comprising:
a first node supplied with a first power supply voltage;
a second node supplied with a second power supply voltage lower than the first power supply voltage;
a logic circuit section formed of a plurality of first transistors of a first conductivity type and a plurality of second transistors of a second conductivity type, the logic circuit section being controlled according to an input signal, a current path of each of the second transistors having one end connected to the first node, and another end connected to an output terminal of the logic circuit section;
a third transistor of the first conductivity type connected between the logic circuit section and the second node;
a fourth transistor of the second conductivity type connected between the first node and the output terminal of the logic circuit section, the fourth transistor setting a level at the output terminal to the first power supply voltage when the logic circuit section does not operate;
a first control signal used to control the first and second transistors;
a second control signal different from the first control signal and used to control the third transistor; and
a third control signal different from the first control signal and used to control the fourth transistor.

15. The circuit according to claim 14, wherein threshold voltages of the first to fourth transistors are set to have a single absolute value.

16. The circuit according to claim 14, wherein a high level of the first control signal is a first voltage, and a low level of the first control signal is a second voltage lower than the first voltage, a high level of the second control signal being the first voltage, a low level of the second control signal being a third voltage lower than the second voltage, a high level of the third control signal being a fourth voltage higher than the first voltage.

17. The circuit according to claim 16, wherein the third voltage is a negative voltage.

18. The circuit according to claim 14, wherein an absolute value of threshold voltages of the first and second transistors of the logic circuit section is set to a first threshold voltage, the third transistor being set to have a second threshold voltage whose absolute value is higher than an absolute value of the first threshold voltage, the fourth transistor being set to have one of the first and second threshold voltages.

19. The circuit according to claim 18, wherein the third and fourth transistors are controlled by a single voltage.

20. A semiconductor integrated circuit comprising:
a first node supplied with a first power supply voltage;
a second node supplied with a second power supply voltage lower than the first power supply voltage;
a logic circuit section formed of a plurality of first transistors of a first conductivity type and a plurality of second transistors of a second conductivity type, the logic circuit section being controlled according to an input signal, a current path of each of the first transistors having one end connected to an output terminal of the logic circuit section, and another end connected to the second node;
a third transistor of the second conductivity type connected between the logic circuit section and the first node;
a fourth transistor of the first conductivity type connected between the output terminal of the logic circuit section and the second node, the fourth transistor setting a level at the output terminal to the first power supply voltage when the logic circuit section does not operate;
a first control signal used to control the first and second transistors;
a second control signal different from the first control signal and used to control the third transistor; and
a third control signal different from the first control signal and used to control the fourth transistor.

21. The circuit according to claim 20, wherein threshold voltages of the first to fourth transistors are set to have a single absolute value.

22. The circuit according to claim 20, wherein a high level of the first control signal is a first voltage, and a low level of the first control signal is a second voltage lower than the first voltage, a high level of the second control signal being a third voltage higher than the first voltage, a low level of the second control signal being the first voltage, a high level of the third control signal being a fourth voltage higher than the first voltage, a low level of the third control signal being a fifth voltage lower than the second voltage.

23. The circuit according to claim 22, wherein the fifth voltage is a negative voltage.

24. The circuit according to claim 22, wherein an absolute value of threshold voltages of the first and second transistors of the logic circuit section is set to a first threshold voltage, the third transistor being set to have a second threshold voltage whose absolute value is higher than an absolute value of the first threshold voltage, the fourth transistor being set to have one of the first and second threshold voltages.

25. The circuit according to claim 24, wherein the third and fourth transistors are controlled by a single voltage.

* * * * *